United States Patent [19]
Fallico et al.

[11] Patent Number: 5,796,157
[45] Date of Patent: Aug. 18, 1998

[54] HIGH-FREQUENCY LATERAL PNP TRANSISTOR

[75] Inventors: Giuseppe Fallico, Aci Castello; Raffaele Zambrano, Giovanni la Punta, both of Italy

[73] Assignee: Consorzio per la Ricerca sulla Microelettronica nel Mezzogiorno, Catania, Italy

[21] Appl. No.: 547,881

[22] Filed: Oct. 25, 1995

[30] Foreign Application Priority Data

Oct. 26, 1994 [EP] European Pat. Off. ............. 94830500

[51] Int. Cl.$^6$ .................................................. H01L 29/00
[52] U.S. Cl. ................................... 257/557; 257/588
[58] Field of Search ........................... 257/557, 565, 257/588, 592, 506

[56] References Cited

U.S. PATENT DOCUMENTS 5,323,057  6/1994  Cook et al. ............................. 257/591
5,493,149  2/1996  Jerome et al. ......................... 257/557

FOREIGN PATENT DOCUMENTS

A-0 526 374  2/1993  European Pat. Off. ........ H01L 21/31

OTHER PUBLICATIONS

IBM Technical Disclosure Bulletin, vol. 21, No. 10, pp. 4050–4052, by Wieder, Mar.1979.
Patent Abstracts of Japan, vol. 12, No. 281 (E–641)(3128) Aug. 2, 1988 & JP-A-63 058 870 Fujitsu Ltd.

IBM Technical Disclosure Bulletin, vol. 22, No. 10, Mar. 1980, New York US, p. 4543, E. Berndlmaier, et al., "Lateral PNP Transistor with Minimal Basewidth".

IBM Technical Disclosure Bulletin, vol. 25, No. 8, Jan. 1983, New York US, pp. 4171–4173, T.H. Ning "Narrow--Base Epitaxial-Base Lateral PNP".

International Electron Devices Meeting Technical Digest 1989, Dec. 1989, Washington, DC USA, pp. 791–794, P.C. Hunt, "Bipolar Device Design for High Density High Performance Applications".

IEEE Transactions On Electron Devices, vol. 41, No. 3, Mar. 1994, New York US pp. 321–329, T. Yamaguchi, et al., Process Investigations For a 30 Ghz ft Submicrometer Double Poly-Si Bipolar Technology.

Primary Examiner—Mark V. Prenty
Attorney, Agent, or Firm—Wolf, Greenfield & Sacks, P.C.

[57] ABSTRACT

A high-frequency lateral PNP transistor includes a base region laterally delimited by P type emitter and collector regions, and at the top by a surface portion of the N type semiconductor body housing the active area of the transistor. The surface portion delimiting the base region presents no formations of insulating material grown across the surface, so that the width ($W_B$) of the base region is reduced and ensures optimum dynamic characteristics of the transistor. The base contact may be located directly over the surface portion facing the base region, to reduce the extrinsic base resistance and overall size of the device, or it may be located remotely and connected to the base region by a buried layer and sinker region to further reduce the base width.

13 Claims, 5 Drawing Sheets

HIGH-FREQUENCY LATERAL PNP TRANSISTOR

BACKGROUND OF THE INVENTION

1. Field of the Invention

The present invention relates to a high-frequency lateral PNP transistor.

2. Discussion of the Related Art

As is known, NPN transistors are the components most commonly used in both analog and digital bipolar integrated circuits. For them to operate at high switching frequencies, sophisticated fabrication techniques have been devised, such as: dielectric or trench isolation; use of one or more polycrystalline silicon (polysilicon) layers; self-alignment by means of silicon oxide spacers or composite materials; rapid thermal processes (RTP); and using silicides and/or polycides (i.e. double layers formed of a layer of polysilicon and a layer of silicide).

An overview of the problems involved in fabricating high-frequency NPN transistors is to be found in the article entitled: "Bipolar Device Design for High Density, High Performance Applications", by P. C. Hunt, presented at IEDM 89, 1989 IEEE, p. 791-794.

An NPN transistor structure developed by the present Applicant is shown in FIG. 1 and described below.

FIG. 1 shows a cross section of a wafer of semiconductor material 1 including a P⁻ type substrate 2; an N⁺ type buried layer 3; and an N⁻ type epitaxial layer 4. A trench isolation region 5 peripherally defines the area (active area) in which the NPN transistor is formed. The trench isolation region 5 comprises a nondoped polysilicon region 6 extending vertically from surface 35 of wafer 1, through epitaxial layer 4 and buried layer 3 to substrate 2; a nitride layer 7 surrounding polysilicon region 6 on all sides (except that facing surface 35 of wafer 1); and a thermal oxide layer 8 surrounding nitride layer 7.

Field oxide regions 10, 11 extend across surface 35, the first 10 over the isolation region 5, and the second 11 in an intermediate portion of the active area, so as to define two windows 12, 13 with no oxide covering. An N⁺ type sinker region 14 extends through epitaxial layer 4 from window 12 of surface 35 to buried layer 3; an N⁺ doped polysilicon layer 15 is formed over window 12, in electrical contact with sinker region 14; and a metal collector contact 16 is formed over layer 15.

In epitaxial layer 4, two P⁺ type regions 18, 19 are formed facing window 13 and connected to each other by a P type base region 20. Two P⁺ doped polysilicon layers 22, 23 are formed over regions 18, 19. Layer 23 also extends over field oxide region 11 presenting base contact 24. Oxide regions 25 cover regions 22, 23, 15 and field oxide regions 10, 11, with the exception of the areas in which collector and base contacts 16 and 24 are formed.

The facing lateral edges of regions 22, 23 and of overlying oxide regions 25 are covered with two symmetrical L-shaped thermal oxide portions 26, the horizontal arms of which cover part of surface 35 of wafer 1, and which are in turn covered by two L-shaped silicon nitride regions 27. A substantially U-shaped polysilicon layer 28, doped to present N⁺ type conductivity, fills the gap between the horizontal arms of the L's contacting surface 35 of wafer 1, laterally covers nitride regions 27, and presents two horizontal end portions partially covering oxide regions 25. Polysilicon layer 28, which forms an emitter region, presents a thin N⁺ type layer 29 inside base region 20 and of a width equal to the distance between L-shaped regions 26; and a metal region 30 over polysilicon layer 28 forms the emitter contact of the transistor.

The above structure features cutoff frequencies over 20 GHz, propagation times of about 40 ps, and power-speed products of about 40 fJ.

Though, as stated, NPN transistors are the ones most commonly used in integrated circuits, situations exist in which PNP transistors are also desirable, e.g. for integrating complex logic or analog functions.

FIG. 2 shows one lateral PNP transistor structure proposed in an article by Yamaguchi et al. published in March 1994 in IEEE *Transactions on Electron Devices*, vol. 41, n. 3, p. 321-329. This known solution comprises a P⁻ type substrate 40; an N⁺ type buried layer 41; an N type epitaxial layer 42; P⁺ type emitter and collector regions 43, 44 in epitaxial layer 42; and an N⁺ type sinker region 45 extending from the surface of the device to buried layer 41. A first oxide spacer region 48 separates emitter region 43 from collector region 44; and a second oxide spacer region 49 separates collector region 44 from sinker region 45; spacer regions 48, 49 are grown in the form of thermal oxide across the surface of the wafer. Polysilicon regions 50-52, doped similarly to regions 43-45, are deposited over the surface of the wafer at regions 43-45; and the emitter, collector and base contacts 53, 54, 55 are formed over regions 50-52.

In the FIG. 2 transistor, current flows parallel to the surface; the P⁺ doped polysilicon regions 50 and 51 provide for contacting emitter region 43 and collector region 44; and the base region is formed by the portion 42' of epitaxial layer 42 extending between regions 43 and 44. Portion 42' is accessed by the low-resistivity path including polysilicon region 52, sinker region 45, and buried layer 41.

The above known structure, however, fails to provide for good static characteristics (in particular, it presents low $h_{fe}$ values), and dynamic performance is also unsatisfactory. In fact, the base width-indicated $W_B$ in FIG. 2 and which determines the gain of the transistor-cannot be reduced to less than 2-2.5 μm on account of the alignment tolerances of the various layers, and the limits posed by the growth of spacer region 48 and by the presence of "bird's beaks" growing beneath the oxidation mask, at the edges of the oxide region. The impossibility of accurately controlling the size of the "bird's beaks" is also a major source of imprecision in the sizing of the base width.

It is an object of the present invention to provide a PNP transistor of superior performance as compared with known solutions, and which, preferably, may be formed using the same technology as the NPN component in FIG. 1, with only minor alterations to the fabrication process, for permitting PNP and NPN transistors to be fabricated simultaneously in the same integrated device.

SUMMARY OF THE INVENTION

According to the present invention, there is provided a high-frequency lateral PNP transistor. The transistor is formed on a semiconductor body having a substrate of P-type conductivity, a buried layer of N+ type conductivity over the substrate, and an epitaxial layer of N- type conductivity over the buried layer. Emitter and collector regions of P+ type conductivity are formed in the epitaxial layer. The emitter and collector regions are separated to form a base region. Since the base region is formed between the collector and emitter regions, it can be formed with a reduced width.

In one aspect of the invention, the base contact can be connected to the base region through a polysilicon layer over the base region. The polysilicon layer can be separated from the emitter and collector contact regions by an L-shaped spacer and an inverse-L-shaped spacer.

In another aspect of the invention, a U-shaped spacer with a polisilicon layer disposed over and within the spacer can be positioned over the base region. The base contact can be formed over a separate portion of the semiconductor body and connected to the base region through a sinker region and buried layer.

In another aspect of the invention, trench isolation regions can be formed to define an active region which includes the emitter region, collector region and base region.

In practice, according to the present invention, the thermal oxide layer is not grown across the surface over the base region between the emitter and collector. Therefore, the base width does not depend on the thermal oxide growing process and is determined by other characteristics of the fabrication process, can have a reduced minimum size, and has greater accuracy.

BRIEF DESCRIPTION OF THE DRAWINGS

Two preferred, non-limiting embodiments of the present invention will be described by way of example with reference to the accompanying drawings, in which.

DETAILED DESCRIPTION

Figure 1:
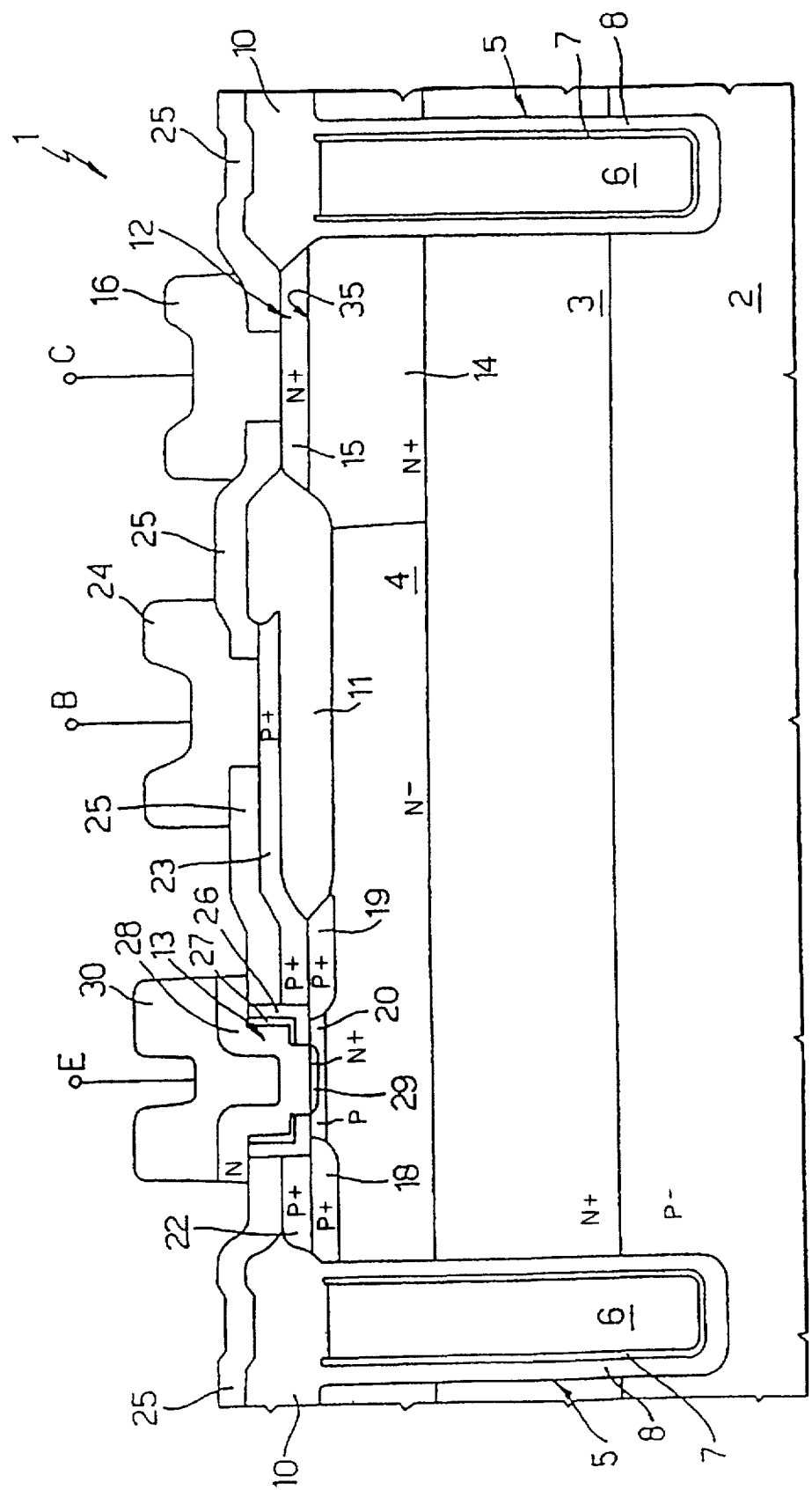
FIG. 1 shows a cross section of a silicon wafer incorporating a known NPN transistor.
Figure 3:
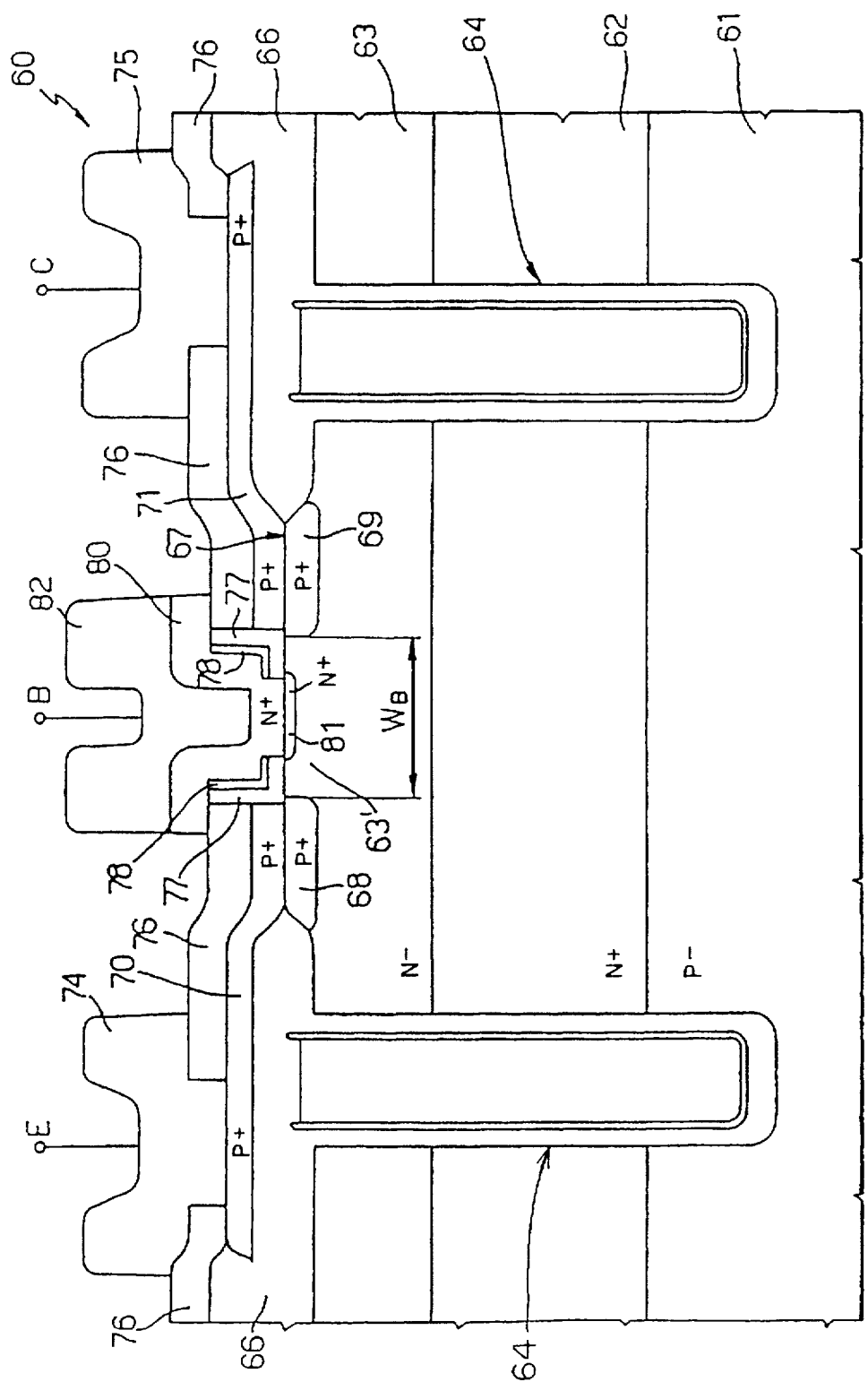
FIG. 3 shows a cross section of a silicon wafer incorporating a PNP transistor in accordance with the present invention.

Number 60 in FIG. 3 indicates a silicon wafer comprising a P⁻ type substrate 61, an N⁺ type buried layer 62 and an N⁻ type epitaxial layer 63, similar to layers 2-4 in FIG. 1. A trench isolation region 64, identical to region 5 in FIG. 1 and therefore not described further, isolates the region in which the PNP transistor is formed from the adjacent regions in which other components are integrated.

A field oxide region 66 extends across the surface 67 of the wafer, over isolation region 64, so as to peripherally define the active area of the PNP transistor.

In epitaxial layer 63, two spaced P⁺ type emitter and collector regions 68, 69 are formed facing surface 67. Over emitter and collector regions 68, 69, there are formed two P⁺ doped polysilicon contact regions 70, 71. A portion of each polysilicon contact region 70, 71 directly contacts surface 67 (and hence regions 68, 69). A portion also extends over field oxide region 66 where respective emitter and collector contacts 74 and 75 are formed. An oxide layer 76 covers regions 70, 71 and field oxide layers 66, with the exception of the areas in which emitter and collector contacts 74 and 75 are formed.

The facing lateral edges of regions 70, 71 and of overlying oxide layer 76 are covered with two symmetrical L-shaped portions of thermal oxide 77, the horizontal side of which covers part of surface 67 of wafer 1, and which are in turn covered with two symmetrical L-shaped silicon nitride regions 78. A substantially U-shaped polysilicon layer 80, doped to present N⁺ type conductivity, fills the gap between the horizontal arms of the L's contacting surface 67 of wafer 60, laterally covers nitride regions 78, and presents two horizontal end portions partially covering oxide layer 76. Polysilicon layer 80, which forms a base contact region, presents a thin N⁺ type layer 81 inside epitaxial layer 63; and a metal region 82 over polysilicon layer 80 forms the base contact of the transistor.

Figure 2:
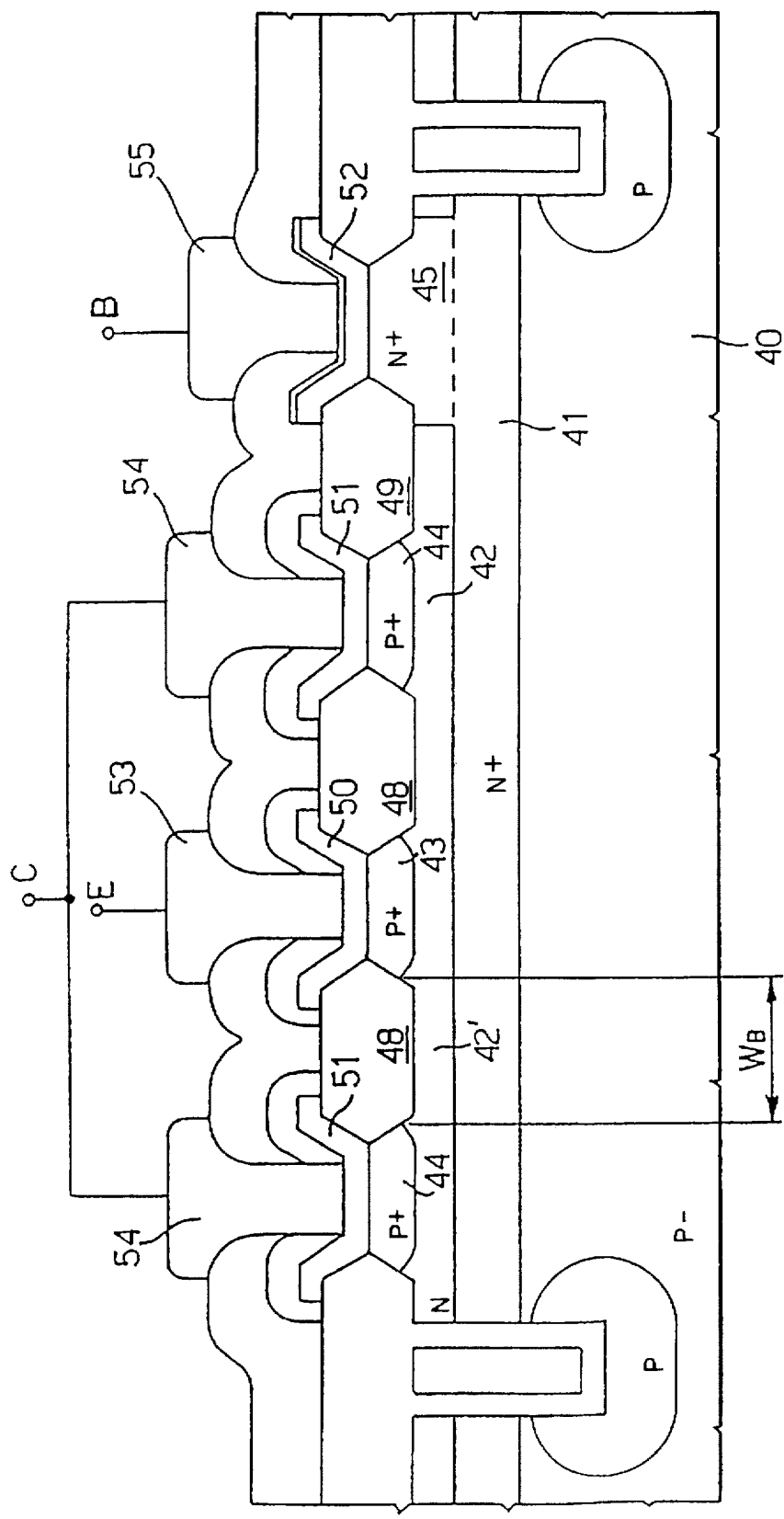
FIG. 2 shows a cross section of a silicon wafer incorporating a known PNP transistor.

In the FIG. 3 transistor, the base region is formed by portion 63' of the epitaxial layer. The width (base width $W_B$) of the base region is defined by the distance between regions 68 and 69, and therefore substantially (with the exception of the lateral diffusion of regions 68, 69) by the distance between the facing edges of polysilicon regions 70 and 71. This distance can be determined by a plasma etching photolithographic step. This technique achieves smaller minimum dimensions and, though depending on the equipment used, far greater precision as compared with the thermal oxidation (planox) process used for growing oxide region 48 of the FIG. 2 transistor. More specifically, the technique can achieve a base width $W_B$ of about 0.8 μm.

In the FIG. 3 transistor, the polysilicon layer 80 between regions 70 and 71 provides for minimizing the extrinsic base resistance $r_{bb'}$ of the transistor, as well as for dispensing with the sinker region normally provided between the base contact and the epitaxial layer (region 14 in FIG. 1 and 45 in FIG. 2), thus greatly reducing the size of the transistor and hence the parasitic capacitances associated with it. As in FIG. 1, the FIG. 3 transistor also provides for improving gain by permitting the use of a less heavily doped epitaxial layer 63 as compared with the known FIG. 2 solution.

As such, the FIG. 3 transistor presents superior dynamic and static characteristics ensuring reliable operation even at high frequency.

As can be seen, the FIG. 3 transistor presents a similar structure to that of FIG. 1, and may therefore be formed using the same technology and simultaneously with a FIG. I transistor. More specifically, regions 70 and 71 may be formed simultaneously with regions 22, 23 in FIG. 1, and, like regions 22, 23 for regions 18, 19, constitute diffusion sources for emitter and collector regions 68 and 69, which are thus formed by dope diffusion from regions 70 and 71, with no need for specific implant or diffusion steps. Similarly, spacer regions 77, 78 and N+ doped polysilicon region 80 may be formed simultaneously with corresponding spacer regions 26, 27 and polysilicon region 28 in FIG. 1, by appropriately modifying the mask. A special mask must be provided, however, to prevent the base implant for forming region 20 in FIG. 1 from penetrating the base region of the FIG. 3 transistor.

In the FIG. 3 transistor, the minimum base width is determined by the need to prevent the two horizontal arms of the L's from touching during the successive steps for defining spacer regions 77 and 78; which condition therefore imposes a minimum distance between polysilicon emitter and collector regions 70, 71, and hence a minimum base width $W_B$.

Figure 4:
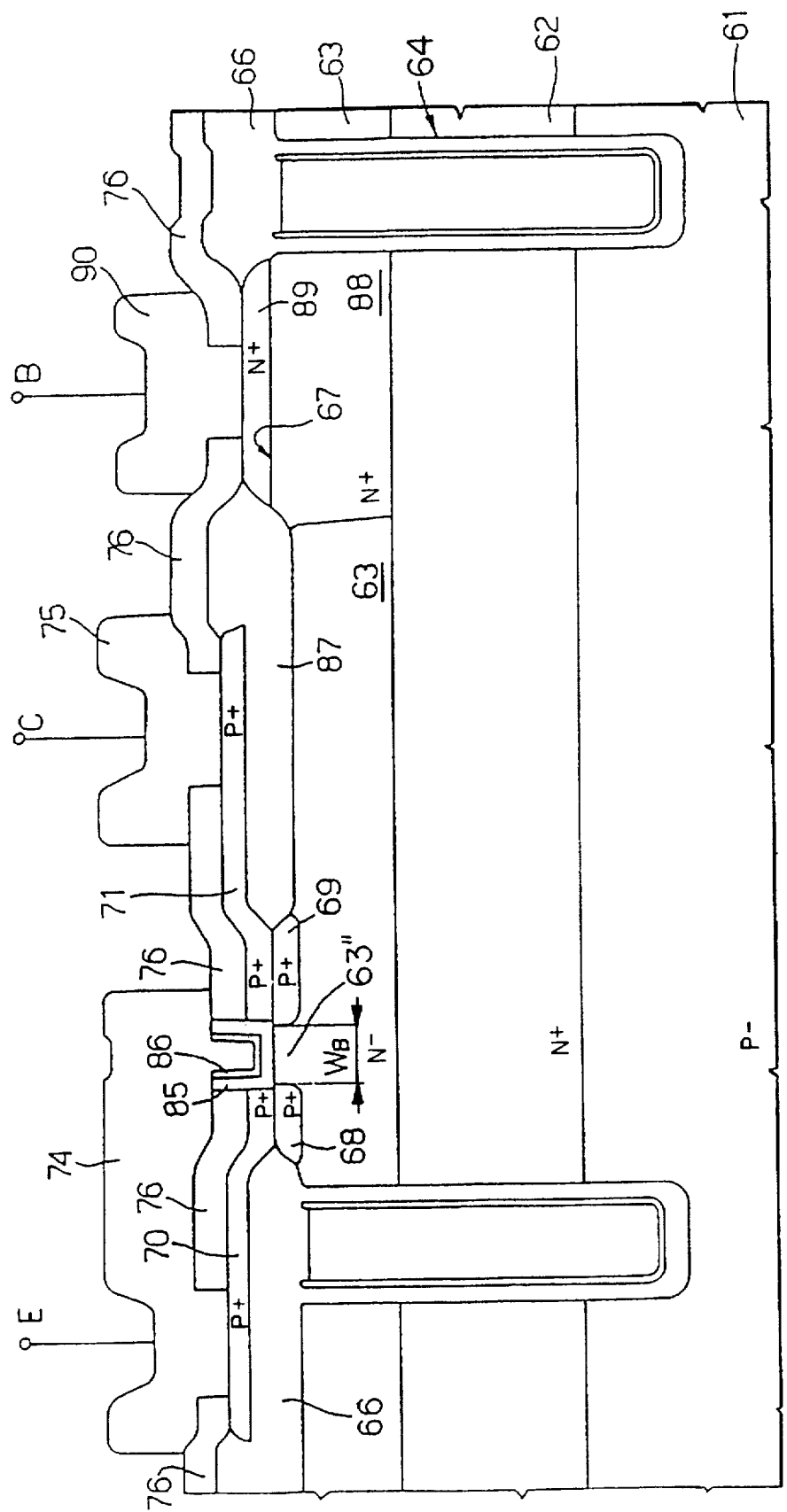
FIG. 4 shows a variation of the FIG. 3 transistor.

This problem may be overcome using the structure of FIG. 4. The base contact is not formed between the emitter and collector regions. The base region is accessed via a buried layer and a sinker region.

In the FIG. 4 transistor, the distance between polysilicon emitter and collector regions 70 and 71 is so selected that the two horizontal arms of the two L-shaped spacer regions 77 in FIG. 3 are not separated, and join to form a single U-shaped oxide spacer region 85. Similarly, nitride regions 78 join to form a single U-shaped nitride region 86; and a field oxide region 87 is formed across the surface of the wafer to divide the active area into two parts: one integrating emitter and collector regions 68, 69 and the base region (portion 63" of the epitaxial layer), and a part in which is formed an N+ type sinker region 88 extending from surface 67 to buried layer 62. On surface 67, at sinker region 88, an N+ doped polysilicon layer 89 is formed with a base contact 90 on top.

Unlike the FIG. 3 transistor, the N+ doped silicon layer for forming region 89 of the FIG. 4 transistor is easily removable from surface 67 at base region 63". In the first embodiment, in fact, region 80 cannot be removed, due to the risk of over-etching down to the epitaxial layer and so damaging the base region; whereas, in the second embodiment in FIG. 4, the N+ polysilicon layer may safely be removed because epitaxial layer 63 at base region 63" is protected by oxide and nitride regions 85, 86.

In the FIG. 4 embodiment, metal line 74 forming the emitter contact is extended over base region 63" to prevent the formation of inverted surface layers between the emitter and collector.

Except for a different layout and special mask design, the FIG. 4 embodiment involves no changes to the fabrication process of the FIG. 1 NPN transistor.

Figure 5:
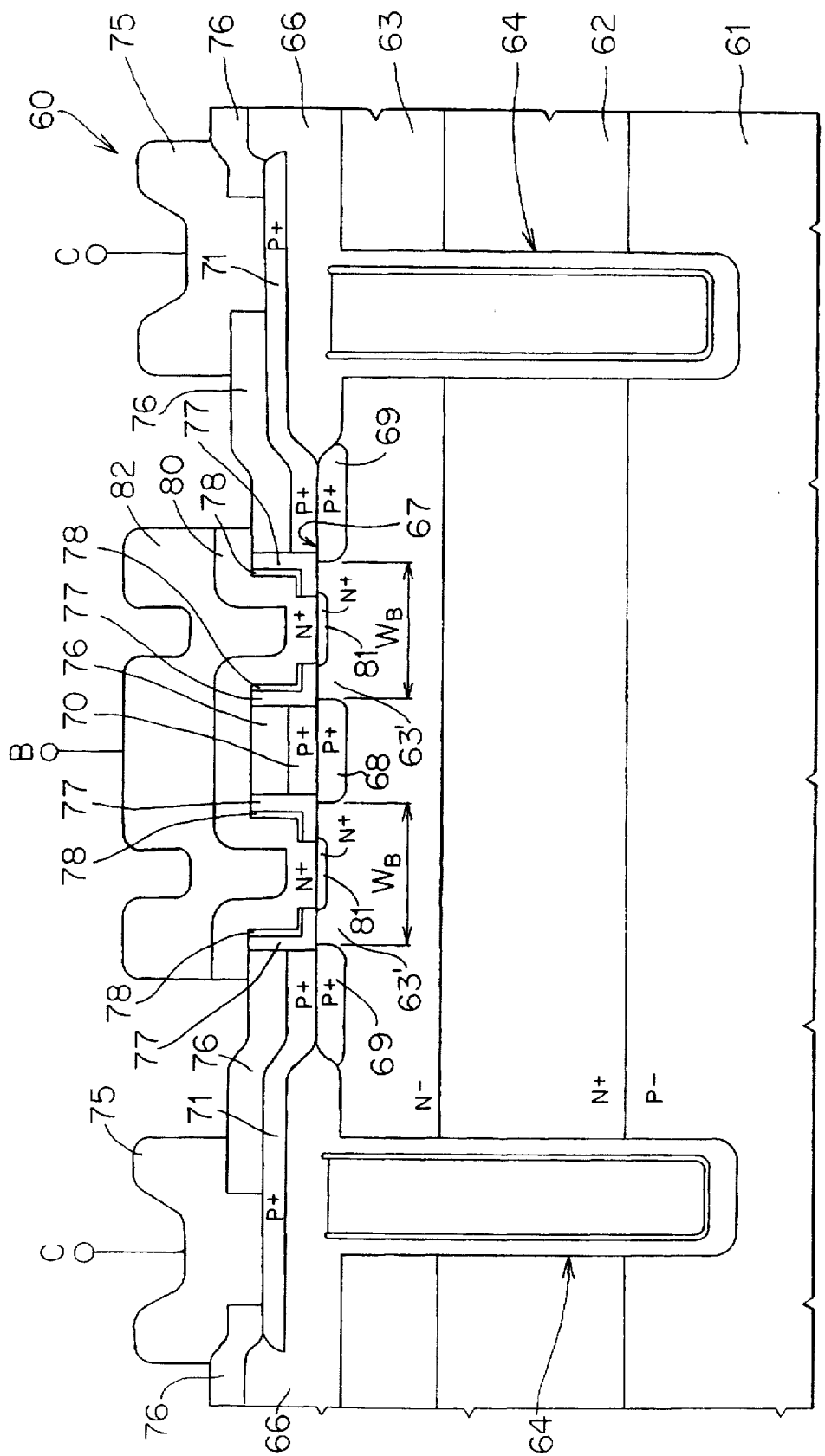
FIG. 5 shows a further variation of the FIG. 3 transistor.

FIG. 5 shows another embodiment of the present transistor, similar to FIG. 3 transistor, except for base region 81 and contact region 70 which in the FIG. 5 embodiment, have a radial symmetry and for the emitter contact 74, which is not visible in FIG. 5, being located in a different cross-section.

In practice, in the embodiment according to FIG. 5, the collector region 69 completely surrounds emitter region 68, thus optimizing current collection; thus the transistor of FIG. 5 has a better saturation resistance and gain. Furthermore, the FIG. 5 structure, having base contacts circumpherentially arranged around the emitter region 68, has a reduced base resistance $r_{bb'}$.

A similar technique can be applied to the FIG. 4 embodiment to improve the transistor current capability as well as its current gain.

The advantages of the transistor according to the present invention are as follows. In particular, eliminating the field oxide layer across the surface over the base region greatly reduces the base width and hence increases the gain of the transistor; and reducing the size and defectiveness of the transistor provides for improved dynamic performance, as well as for allowing use of the transistor in high-frequency applications.

Clearly, changes may be made to the transistor as described and illustrated herein without, however, departing from the scope of the present invention.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A high-frequency lateral PNP transistor comprising:
   a semiconductor body of a first conductivity type having a surface;
   an emitter region of a second conductivity type in a first surface portion of said semiconductor body facing said surface;
   a collector region of the second conductivity type in a second surface portion of said semiconductor body facing said surface, and the second portion being spaced apart from said first portion so that a third surface portion is between said first surface portion and said second surface portion;
   thick insulation portions formed across portions of said surface and not formed across the first, second and third surface portions;
   an emitter contact region of conductive material having a first contact portion contacting said emitter region and a second contact portion extending over one of said thick insulation portions;
   an emitter contact in direct electrical contact with said second contact portion of said emitter contact region;
   a collector contact region of conductive material having a first contact portion contacting said collector region and a second contact portion extending over one of said thick insulation portions; and
   a collector contact in direct electrical contact with said second contact portion of said collector contact region;
   at least two L-shaped spacer regions of insulating material arranged symmetrically with respect to each other and having horizontal portions in contact with said third surface portion, a vertical portion of one of the L-shaped spacer regions contacting the first contact portion of the emitter contact region, and a vertical portion of another one of the L-shaped spacer regions contacting the first contact portion of the collector contact region; and
   a base region formed in the semiconductor body at the third surface portion.

2. A transistor as claimed in claim 1, wherein said emitter contact region and said collector contact region are of semiconductor materials.

3. A transistor as claimed in claim 1, wherein said emitter and collector contact regions are insulated from each other by the L-shaped spacer regions.

4. A transistor as claimed in claim 3, further comprising a base contact region extending at least partially between said L-shaped spacer regions so as to be in direct electrical contact with said base region at said third portion of said surface.

5. A transistor as claimed in claim 4, wherein said base contact region includes:
   a semiconductor base contact region of semiconductor material, and
   a metal base contact region;
   wherein said semiconductor base contract region of semiconductor material is substantially U-shaped with its base over and directly contacting said third portion of said surface, and with its arms adjacent to said L-shaped spacer regions; and
   wherein said metal base contact region is located over and in direct electrical contact with said semiconductor base contact region.

6. A transistor as claimed in claim 1, further comprising:
   a base contact region located over a fourth portion of said surface remote from said third portion of said surface; and
   a low-resistivity path formed in said semiconductor body to connect said base contact region to said base region.

7. A transistor as claimed in claim 6, wherein said base contact region includes:
   a semiconductor base contact region of semiconductor material, and a metal base contact region;

wherein said semiconductor base contact region is located over and in direct electrical contact with said fourth portion of said surface; and wherein said metal base contact region is located over said semiconductor base contact region of semiconductor material.

8. A transistor as claimed in claim 6, wherein said low-resistivity path includes:

a highly conductive buried layer extending in said semiconductor body away from said surface; and a highly conductive sinker region extending between said fourth portion of said surface and said buried layer.

9. A transistor as claimed in claim 8, further comprising insulating material across portions of said surface which electrically separate said emitter region, said base region and collector region from said sinker region.

10. A transistor as claimed in claim 6, wherein the L-shaped spacer regions are joined to form a U-shaped spacer region of insulating material with a base and two arms; wherein said base is located directly over said third portion of said surface.

11. A transistor as claimed in claim 10, characterized in that it comprises an emitter metal region located at least partially over said emitter contact region and extending over said U-shaped region and said base region.

12. A transistor as claimed in claim 6, further comprising trench isolation formations surrounding an active area in said semiconductor body, said active area including said emitter region, said collector region, said base region, and said low-resistivity path.

13. A transistor as claimed in claim 1, further comprising trench isolation formations surrounding an active area in said semiconductor body, said active area including said emitter region, said collector region, and said base region.

* * * * *